US008102654B2

(12) United States Patent
Tsuboi et al.

(10) Patent No.: US 8,102,654 B2

(45) Date of Patent: Jan. 24, 2012

(54) FIXATION STRUCTURE FOR CONNECTOR OF IN-VEHICLE CONTROLLER

(75) Inventors: Takashi Tsuboi, Okazaki (JP); Hiroyuki Kawata, Chiryu (JP); Yasuyoshi Toda, Toyohashi (JP)

(73) Assignee: Denso Corporation, Kariya (JP)

( * ) Notice: Subject to any disclaimer, the term of this patent is extended or adjusted under 35 U.S.C. 154(b) by 138 days.

(21) Appl. No.: 12/752,553

(22) Filed: Apr. 1, 2010

(65) Prior Publication Data

US 2010/0254091 A1 Oct. 7, 2010

(30) Foreign Application Priority Data

Apr. 3, 2009 (JP) .................................. 2009-91449

(51) Int. Cl.
*H05K 7/20* (2006.01)
*H01R 13/00* (2006.01)

(52) U.S. Cl. ........ 361/707; 361/704; 361/719; 361/720; 165/80.1; 174/16.2; 439/485; 439/487

(58) Field of Classification Search ........................ None
See application file for complete search history.

(56) References Cited

U.S. PATENT DOCUMENTS

| | | | | |
|---|---|---|---|---|
| 5,281,154 | A * | 1/1994 | Comerci et al. | 439/107 |
| 5,902,152 | A * | 5/1999 | Robert | 439/620.21 |
| 6,370,026 | B2 * | 4/2002 | Sunaga et al. | 361/719 |
| 6,600,653 | B2 * | 7/2003 | Koike et al. | 361/704 |
| 7,643,296 | B2 * | 1/2010 | Yamada et al. | 361/704 |
| 7,835,156 | B2 * | 11/2010 | Kubokawa et al. | 361/760 |

FOREIGN PATENT DOCUMENTS

JP 8-17494 1/1996

* cited by examiner

*Primary Examiner* — Boris Chervinsky

(74) *Attorney, Agent, or Firm* — Nixon & Vanderhye PC

(57) ABSTRACT

A connector fixation structure includes: a connector having a rectangular connector body, protrusions protruding from facing sides in a wing like manner, and a terminal embedded in and protruding from the connector body; a heat sink having a plate shape body, a through hole and columnar convexities; and a printed board. The bottom of the connector is inserted into the through hole of the heat sink. Each columnar convexity is disposed on the plate shape body at a predetermined position corresponding to the protrusion. The top of the connector contacts a first surface of the printed board, and each columnar convexity is fixed to the printed board via the corresponding protrusion with a first screw.

8 Claims, 3 Drawing Sheets

FIXATION STRUCTURE FOR CONNECTOR OF IN-VEHICLE CONTROLLER

CROSS REFERENCE TO RELATED APPLICATION

This application is based on Japanese Patent Application No. 2009-91449 filed on Apr. 3, 2009, the disclosure of which is incorporated herein by reference.

FIELD OF THE INVENTION

The present invention relates to a fixation structure for a connector of an in-vehicle controller.

BACKGROUND OF THE INVENTION

Conventionally, a controller for controlling an EPS (electric power steering) system mounted on a vehicle has a structure for fixing a vertical type connector so as to insert and remove the connector vertically with respect to a surface of a printed board. FIG. 1 shows an example of the structure. The vertical type connector 11 made of resin is fixed to a heat sink 12 made of metal with a screw 13. The heat sink 12 is fixed to a printed board 14 with another screw 15. The connector 11 includes a terminal 17, 18, which protrudes from an inner portion of the connector 11 toward an outside of the connector 11. The terminal 17, 18 has an elongated shape, and a power source voltage current and a signal flows through the terminal 17, 18. The terminal 17, 18 penetrates through a through hole of the printed board 14 so that an end of the terminal 17, 18 is bonded to the printed board 14 with a solder 19.

A collar 11*a* made of metal is embedded in a screw portion of the connector 11 so as to be screwed in a vertical direction of the connector 11. Thus, the metal collar 11*a* is embedded in the resin connector 11. The collar 11*a* has a cylindrical shape. The screw 13 is engaged (i.e., screwed) with the collar 11*a* so that the connector 11 is fixed to the heat sink 12. Thus, the collar 11*a* is used for the screw portion because the resin connector 11 may expand and contract so that the screw 13 looses and the connector 11 is removed from the heat sink 12 if the screw 13 is directly engaged with the resin connector 11.

The above connector structure is described in JP-A-H08-17494.

However, in the above connector structure, since a thermal expansion coefficient of the connector 11 is different from the printed board 14, a degree of expansion and contraction in the connector 11 is different from the printed board 14. Thus, a stress generates between the connector 11 and the printed board 14. The stress is applied to the terminal 17, 18 so that the solder portion of the terminal 17, 18 is damaged. Thus, the terminal 17, 18 may be disconnected to the printed board 14. To protect the solder portion, a length of the terminal 17, 18 is increased so that expansion and contraction in the connector 11 and the printed board 14 are absorbed. In view of assembling performance between the terminal 17, 18 and the printed board 14, a distance G1 between the heat sink 12 and the printed board 14 is reduced.

Further, since the collar 11*a* is embedded in the resin connector 11 so as to fix the connector 11 on the heat sink 12, a manufacturing cost of the connector 11 increases.

SUMMARY OF THE INVENTION

In view of the above-described problem, it is an object of the present disclosure to provide a fixation structure for a vertical type connector of an in-vehicle controller. The connector is fixed to a printed board in the controller without disconnecting a terminal. The fixation structure is manufactured with a low cost.

According to an example embodiment of the present disclosure, a connector fixation structure for an in-vehicle controller includes: a connector having a rectangular connector body with a top, a bottom and a pair of facing sides, a pair of protrusions protruding from the pair of facing sides in a wing like manner, respectively, and a terminal embedded in the connector body and protruding to an outside of the connector body from the top of the connector body; a heat sink made of metal and having a plate shape body, a through hole disposed on the plate shape body, and a pair of columnar convexities; and a printed board. Each protrusion is disposed on a top side of the connector body. The terminal has a straight shape and conductivity so that a current and a signal flows through the terminal. The bottom of the connector is inserted into the through hole of the heat sink. Each columnar convexity is disposed on the plate shape body at a predetermined position corresponding to the protrusion so that the columnar convexity faces the protrusion. The top of the connector contacts a first surface of the printed board so that the terminal is perpendicular to the first surface of the printed board. Each columnar convexity is fixed to the printed board via the corresponding protrusion with a first screw, which is screwed from a second surface of the printed board opposite to the first surface.

In the above structure, the bottom of the connector is inserted into the through hole of the heat sink so that a middle portion of the connector is supported by the heat sink. Thus, the connector is strongly fixed to the printed board. Further, the length of the terminal can be also lengthened. Thus, stress caused by difference of expansion and contraction between the connector and the printed board is applied to the terminal, the stress is absorbed by the terminal since the length of the terminal is long. Thus, the solder portion of the terminal is not damaged by the stress. Further, since it is not necessary to form a collar in the above structure, the manufacturing cost of the above structure is reduced. Specifically, since the above structure is prepared by a resin molding method of the connector and metal molding method of the heat sink, the manufacturing cost of the structure is reduced.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
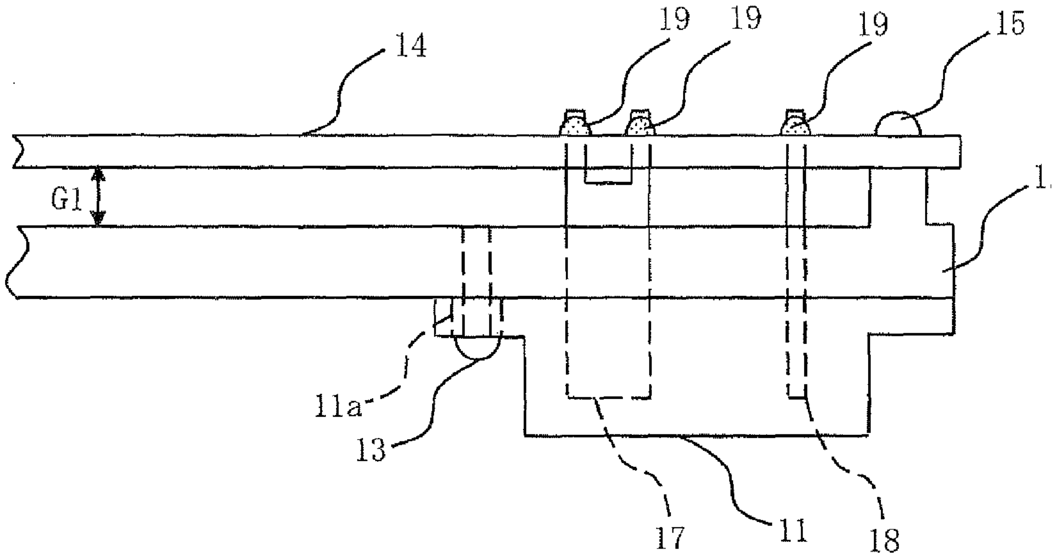
FIG. 1 PRIOR ART
FIG. 1 is a diagram showing a cross sectional view showing a connector fixation structure according to a prior art.
Figure 2:
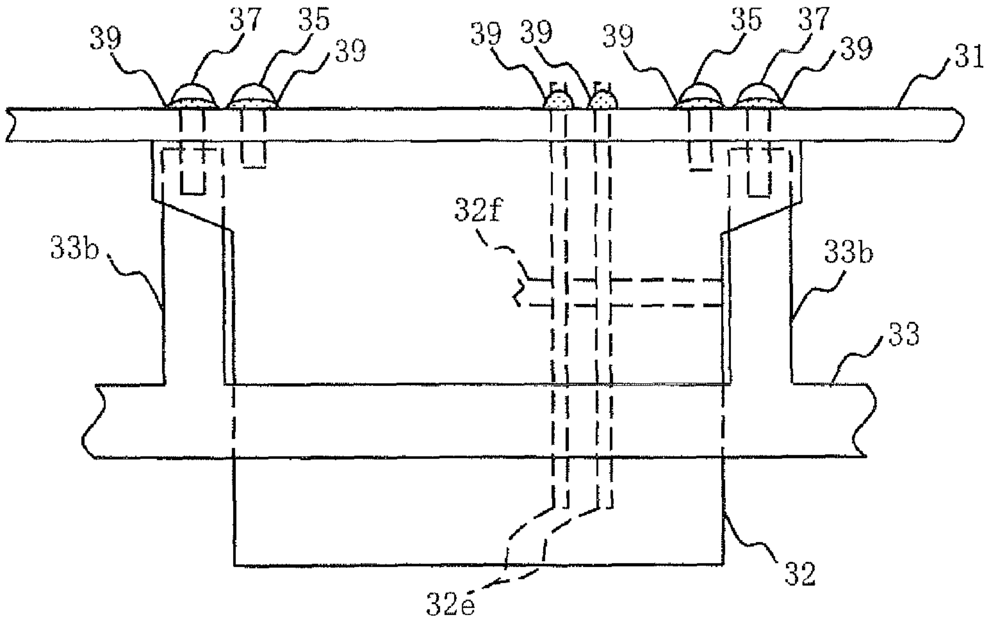
FIG. 2 is a diagram showing a side view of a connector fixation structure of an in-vehicle controller according to an example embodiment.
Figure 3:
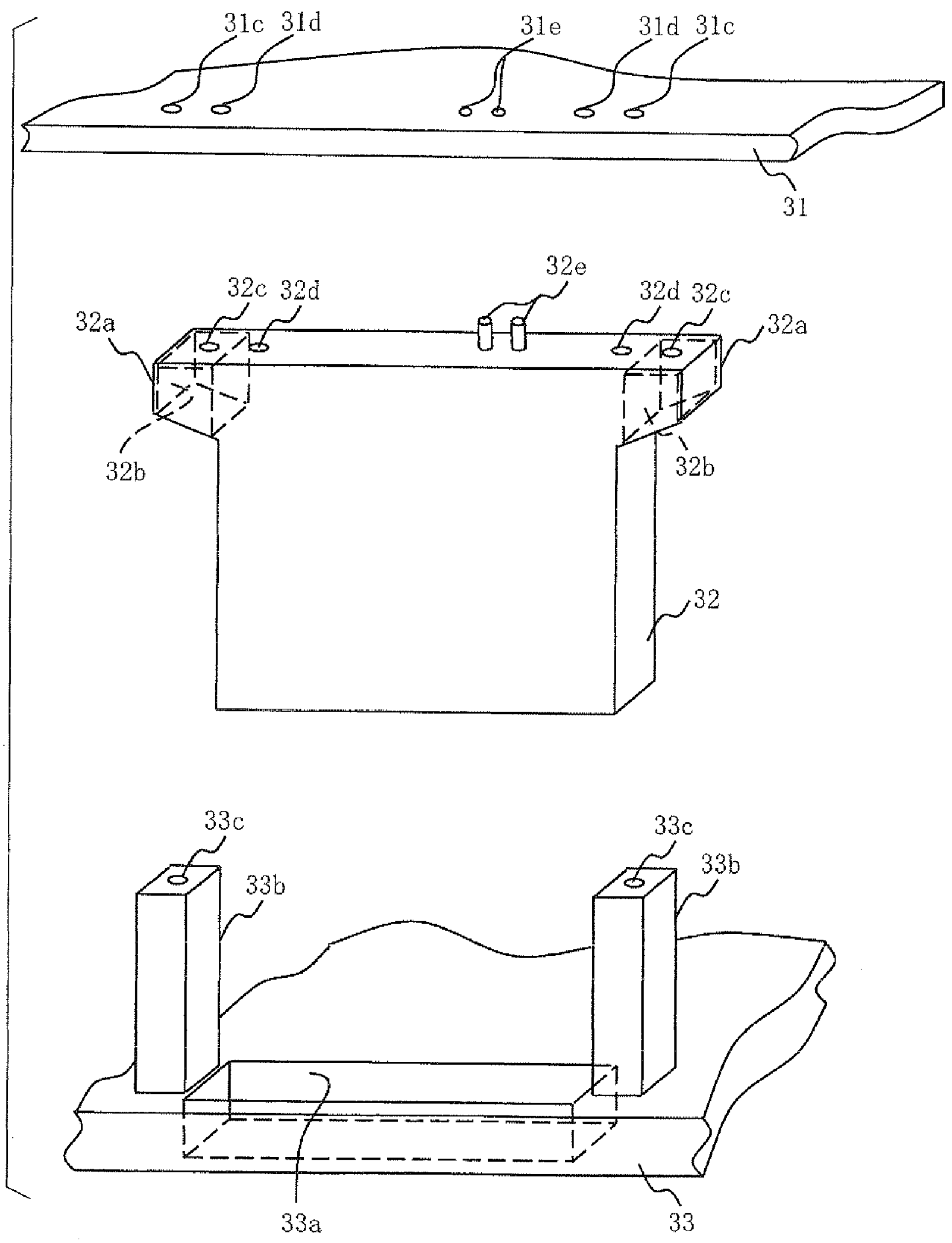
FIG. 3 is a diagram showing an exploded perspective view of main parts of the connector fixation structure.

FIG. 2 shows a side view of a connector fixation structure of an in-vehicle controller according to an example embodiment. FIG. 3 shows an exploded perspective view of main parts of the connector fixation structure.

In the connector fixation structure of the controller such as a EPS system, a vertical type connector 32 made of resin is inserted between a printed board 31 and a heat sink 33 so that the connector 32 is inserted into and removed from the printed board 31 in the vertical direction. Thus, the connector 32 is fixed to the printed board 31 together with the heat sink 33.

As shown in FIG. 3, the connector 32 includes a protrusion 32*a*, which protrudes from a body of the connector 32 in a wing like manner. Specifically, the protrusions 32*a* is disposed on one end portion of each side of the body of the connector 32. The protrusion 32*a* has a rectangular plate shape. The protrusion 32*a* includes a concavity 32*b* so that one surface of the protrusion 32*a* is opened. A through hole 32*c* is disposed on a mounting surface of the protrusion 32*a* in the connector 32, which contacts the printed board 31. A screw is inserted into the through hole 32*c*. Further, the connector 32 includes a screw hole 32*d*, which is disposed on the mounting surface of the body of the connector 32. The screw hole 32*d* is disposed on each side of the body of the connector 32. Specifically, the screw hole 32*d* is disposed inside of the through hole 32*c* of the connector 32. A terminal 32*e* having conductivity and an elongated straight shape protrudes from an inside of the connector 32 toward the outside of the connector 32 in the vertical direction. A power source voltage current and a signal flow through the terminal 32*e*. The terminal 32*e* is inserted into a through hole of a horizontal plate 32*f*, which is formed in the connector 32, so that a vertical statue of the terminal 32*e* is maintained, as shown in FIG. 2.

As shown in FIG. 3, the printed board 31 includes a screw hole 31*c*, another screw hole 31*d* and a through hole 31*e*. The screw hole 31*c* penetrates a substrate of the board 31 and is disposed at a position corresponding to the through hole 32*c* of the connector 32. The other screw hole 31*d* penetrates the substrate of the board 31 and is disposed at a position corresponding to the screw hole 32*d* of the connector 32. The through hole 31*e* penetrates the substrate and is disposed at a position corresponding to the terminal 32*e*.

The heat sink 33 has a thick plate shape. The heat sink 33 includes a through hole 33*a* and a convexity 33*b*. The connector 32 is inserted into the through hole 33*a* of the heat sink 33. The convexity 33*b* having a long columnar shape is engaged with the concavity 32*b* of the connector 32 when the connector 32 is inserted into the through hole 33*a*. A screw hole 33*c* is formed on an end surface of the convexity 33*b*, which is inserted into the concavity 32*b*. The screw hole 33*c* corresponds to the through hole 32*c* of the concavity 32*b*.

Figure 4:
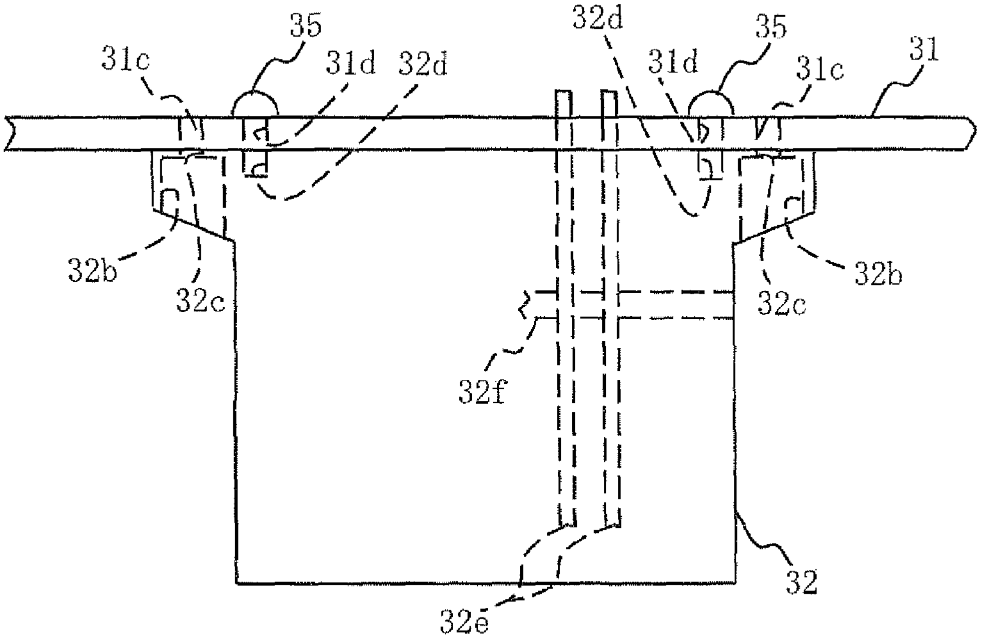
FIG. 4 is a diagram showing a side view of the connector fixation structure in a first assembling step.

When the connector 32 is vertically fixed to the printed board 31 via the heat sink 33, as shown in FIG. 4, the connector 32 is arranged on surface of the printed board 31. Specifically, the through hole 32*c* of the connector 32 coincides with the screw hole 31*c* of the printed board 31. The screw hole 32*d* of the connector 32 coincides with the screw hole 31*d* of the printed board 31. Further, the terminal 32*e* is inserted into the through hole 31*e* of the printed board 31. The connector 32 is directly and vertically fixed to the printed board 31 with a screw 35, which is screwed in the screw hole 31*d*, 32*d* from the other surface of the board 31. This state that the connector 32 is fixed to the printed board 31 with the screw 35 is defined as a direct screw fixation, i.e., a directly fastened state.

Figure 5:
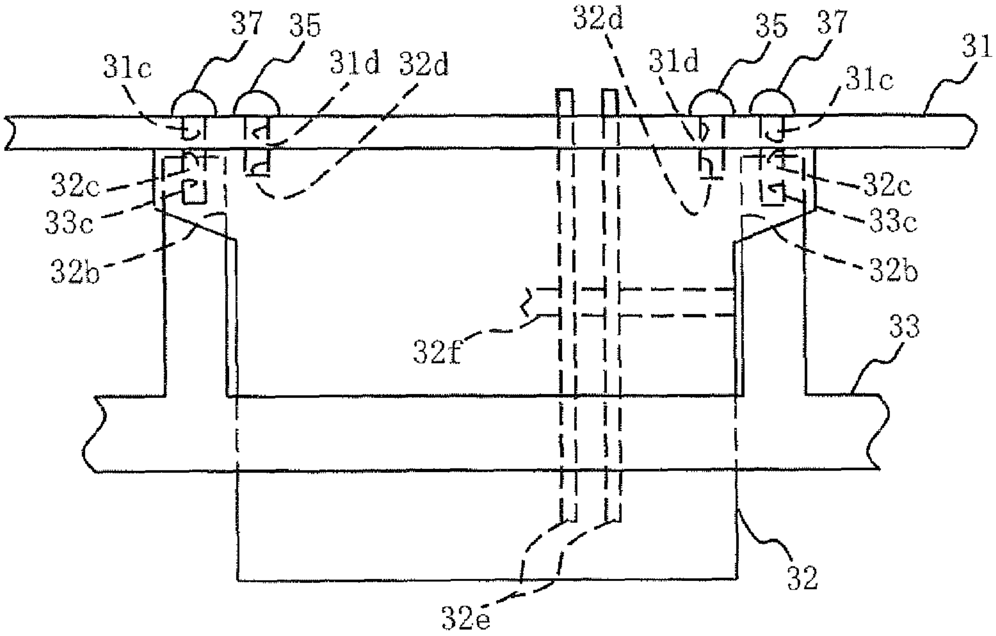
FIG. 5 is a diagram showing a side view of the connector fixation structure in a second assembling step.

Next, as shown in FIG. 5, the connector 32 is inserted into the through hole 33*a* of the heat sink 33, and the convexity 33*b* of the heat sink 33 is inserted into the concavity 32*b* of the connector 32 so that the connector 32 is engaged with the heat sink 33. Under this condition, the heat sink 33 is fixed to the printed board 31 with a screw 37, which is screwed from the other surface of the printed board 31 via the screw hole 31*c*, the through hole 32*c*, and the screw hole 33*c*. In this case, the connector 32 is inserted between the board 31 and the heat sink 33 so that the heat sink 33 is fixed to the printed board 31. This state is defined as a joint screw fixation, i.e., jointly fastened state. Thus, the connector 32 is fixed to the printed board 31 with directly fastened fixation structure and jointly fastened fixation structure.

Next, as shown in FIG. 2, the screws 35, 37 and the terminal 32*e* are soldered with a solder 39. Thus, by soldering the screws 35, 37 and the terminal 32*e*, creep phenomenon is restricted. The creep phenomenon is defined such that a screw looses when resin material expands and contracts. The soldering step of the screws 35, 37 and the terminal 32*e* is performed at the same time as a soldering step, in which the printed board 31 is bonded to another element.

The connector fixation structure has a rectangular shape of the connector 32 with the protrusions 32*a*, which protrudes from one end of each side of the rectangular shape in a wing like manner. The concavity 32*b* is concaved on the one side of the protrusion 32*a*, which is opposite to the mounting surface of the fixation structure. The terminal 32*e* protrudes from the inside of the connector 32 toward the outside of the connector 32. Further, the connector fixation structure further has a metal heat sink 33 including the through hole 33*a* and the convexity 33*b*. A side of the connector 32 opposite to the mounting surface of the connector 32 is inserted into the through hole 33*a*. The convexity 33*b* of the heat sink 33 is engaged with the concavity 32*b* of the connector 32.

The mounting surface of the connector 32 is arranged on the one surface of the printed board 31 so that the terminal 32*e* of the connector 32 is perpendicularly disposed on the printed board 31. The other end side of the connector 32 opposite to the mounting surface is inserted into the through hole 33*a* of the heat sink 33. The convexity 33*b* of the heat sink 33 is engaged with the concavity 32*b* of the connector 32. Under this condition, the convexity 33*b* of the heat sink 33, which is engaged with the concavity 32*b* of the connector 32 is fixed to the printed board 31 with the screw 37 so that the connector fixation structure is formed.

Thus, the connector 32 arranged perpendicularly on the one surface of the board 31 is inserted into the through hole 33*a* of the heat sink 33, and further, the convexity 33*b* of the heat sink 33 is engaged with the concavity 32*b* of the connector 32. Thus, the convexity 33*b* is screwed with the screw 37 such that the screw 37 is fixed to the convexity 33*b* of the heat sink 33 from the other surface of the printed board 31 via the concavity 32*b* of the connector 32. The contact surface of the convexity 33*b* of the heat sink 33 contacts the bottom of the concavity 32*b* of the connector 32. The connector 32 is inserted between the printed board 31 and the heat sink 33. Thus, the jointly fastened structure is formed. The connector 32 is inserted into the through hole 33*a* of the heat sink 33, and a middle portion of the connector 32 is held by the heat sink 33. Thus, the connector 32 is tightly fixed to the board 31.

The middle portion of the connector 32, which is perpendicularly fixed to the printed board 31, is supported by the heat sink 33. Thus, even when the length of a part of the connector 32 that protrudes in the vertical direction is long, and stress is applied to the part of the connector 32 along with the horizontal direction, the connector 32 is supported by the heat sink 33 so as not to fall down or be broken. Thus, the terminal 32*e* partially embedded in the connector 32 and perpendicularly arranged in the connector 32 can be also lengthened. Thus, even when stress caused by difference of expansion and contraction between the connector 32 and the printed board 31 is applied to the terminal 32*e*, the solder portion of the terminal 32*e* is not substantially damaged since the length of the terminal 32*e* is long so that the stress is absorbed by the terminal 32*e*.

The connector fixation structure of the in-vehicle controller does not include a collar. Thus, since the structure is formed by a resin molding method of the connector 32 and metal molding method of he heat sink 33, the manufacturing cost of the structure is reduced.

The connector 32 is fixed to the one surface of the printed board 31 via the screw, which is screwed from the other surface of the printed board 31. Thus, when the connector fixation structure is formed, the connector 32 is directly fixed to the printed board 31 with the screw. Thus, after that, the assembling step of the heat sink 33 and the printed board 31 is easily performed. Since the connector 32 is fixed to the printed board 31 with the directly fastened fixation structure and the jointly fastened fixation structure, the fixation strength between the connector 32 and the printed board 31 is improved.

After the connector 32 is fixed to the convexity 33*b* of the heat sink 33 with the screw 37 from the other side of the printed board 31, the convexity 33*b* being engaged with the concavity 32*b* of the connector 32, the screw 37 is soldered on the printed board 31. Alternatively, after the connector 32 is fixed to the one surface of the printed board 31 with the screw 35 from the other surface of the printed board 31, the screw 35 is soldered on the printed board 31. Thus, since the screws 35, 37 are soldered on the printed board 31, creep phenomenon is restricted. The creep phenomenon provides to loose the screws 35, 37 when the resin connector 32 expands and contracts.

The protrusion 32*a* of the connector 32 may not have the concavity 32*b*. In this case, the contact surface of the protrusion 32*a* contacting the printed board 31 is in parallel to an opposite surface of the contact surface. The top end surface of the convexity 33*b* of the heat sink 33 contacts the opposite surface of the protrusion 32*a*. The printed board 31 is fixed to the convexity 33*b* and the protrusion 32*a* with the screw 37. In this case, the jointly fastened fixation structure is formed in the connector fixation structure.

The above disclosure has the following aspects.

According to an example embodiment of the present disclosure, a connector fixation structure for an in-vehicle controller includes: a connector having a rectangular connector body with a top, a bottom and a pair of facing sides, a pair of protrusions protruding from the pair of facing sides in a wing like manner, respectively, and a terminal embedded in the connector body and protruding to an outside of the connector body from the top of the connector body; a heat sink made of metal and having a plate shape body, a through hole disposed on the plate shape body, and a pair of columnar convexities; and a printed board. Each protrusion is disposed on a top side of the connector body. The terminal has a straight shape and conductivity so that a current and a signal flows through the terminal. The bottom of the connector is inserted into the through hole of the heat sink. Each columnar convexity is disposed on the plate shape body at a predetermined position corresponding to the protrusion so that the columnar convexity faces the protrusion. The top of the connector contacts a first surface of the printed board so that the terminal is perpendicular to the first surface of the printed board. Each columnar convexity is fixed to the printed board via the corresponding protrusion with a first screw, which is screwed from a second surface of the printed board opposite to the first surface.

In the above structure, the connector is inserted between the printed board and the heat sink so that a jointly fasten fixation structure is formed. Further, since the bottom of the connector is inserted into the through hole of the heat sink so that a middle portion of the connector is supported by the heat sink. Thus, the connector is strongly fixed to the printed board. Further, even when the length of the connector is long, the connector is supported by the heat sink even if stress is applied to the connector in the horizontal direction. Thus, the length of the terminal can be also lengthened. Thus, stress caused by difference of expansion and contraction between the connector and the printed board is applied to the terminal, the stress is absorbed by the terminal since the length of the terminal is long. Thus, the solder portion of the terminal is not damaged by the stress. Further, since it is not necessary to form a collar in the above structure, the manufacturing cost of the above structure is reduced. Specifically, since the above structure is prepared by a resin molding method of the connector and metal molding method of he heat sink, the manufacturing cost of the structure is reduced.

Alternatively, each protrusion may have a top surface, which is on a same plane as the top of the connector body. Further, each protrusion may include a concavity, which is opposite to the top surface of the protrusion, and each convexity is engaged with the concavity. In this case, the jointly fastened fixation structure is strengthened.

Alternatively, the connector may be fixed to the first surface of the printed board with a second screw, which is screwed from the second surface of the printed board. In this case, since the connector is fixed to the printed body directly with the second screw, a step of assembling the heat sink with the printed board is easily performed after that. Thus, the connector is fixed to the printed board with the directly fastened fixation structure and jointly fastened fixation structure, so that the connector is tightly bonded to the printed circuit.

Alternatively, the first screw on the second surface of the printed board may be soldered on the printed board. In this case, creep phenomenon providing to loose the screw is restricted.

Alternatively, the printed board may include a through hole, and wherein the terminal is inserted into the through hole so that the terminal is soldered on the second surface of the printed board. Further, the through hole of the heat sink has a rectangular shape, which corresponds to the bottom of the connector, and the pair of columnar convexities are disposed on peripheries of two facing side of the rectangular shape of the heat sink. Furthermore, the connector may be made of resin, and the printed board may be made of resin. The connector is fixed to the first surface of the printed board with a second screw, which is screwed from the second surface of the printed board. The first screw on the second surface of the printed board is soldered on the printed board, and the second screw on the second surface of the printed board is soldered on the printed board.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A connector fixation structure for an in-vehicle controller comprising:

a connector having a rectangular connector body with a top, a bottom and a pair of facing sides, a pair of protrusions protruding from the pair of facing sides in a wing like manner, respectively, and a terminal embedded in the connector body and protruding to an outside of the connector body from the top of the connector body;

a heat sink made of metal and having a plate shape body, a through hole disposed on the plate shape body, and a pair of columnar convexities; and a printed board, wherein each protrusion is disposed on a top side of the connector body, wherein the terminal has a straight shape and conductivity so that a current and a signal flows through the terminal, wherein the bottom of the connector is inserted into the through hole of the heat sink, wherein each columnar convexity is disposed on the plate shape body at a predetermined position corresponding to the protrusion so that the columnar convexity faces the protrusion, wherein the top of the connector contacts a first surface of the printed board so that the terminal is perpendicular to the first surface of the printed board, and wherein each columnar convexity is fixed to the printed board via the corresponding protrusion with a first screw, which is screwed from a second surface of the printed board opposite to the first surface.

2. The connector fixation structure according to claim 1, wherein each protrusion has a top surface, which is on a same plane as the top of the connector body.

3. The connector fixation structure according to claim 2, wherein each protrusion includes a concavity, which is opposite to the top surface of the protrusion, and wherein each convexity is engaged with the concavity.

4. The connector fixation structure according to claim 1, wherein the connector is fixed to the first surface of the printed board with a second screw, which is screwed from the second surface of the printed board.

5. The connector fixation structure according to claim 1, wherein the first screw on the second surface of the printed board is soldered on the printed board.

6. The connector fixation structure according to claim 3, wherein the printed board includes a through hole, and wherein the terminal is inserted into the through hole so that the terminal is soldered on the second surface of the printed board.

7. The connector fixation structure according to claim 6, wherein the through hole of the heat sink has a rectangular shape, which corresponds to the bottom of the connector, and wherein the pair of columnar convexities are disposed on peripheries of two facing side of the rectangular shape of the heat sink.

8. The connector fixation structure according to claim 7, wherein the connector is made of resin, wherein the printed board is made of resin, wherein the connector is fixed to the first surface of the printed board with a second screw, which is screwed from the second surface of the printed board, wherein the first screw on the second surface of the printed board is soldered on the printed board, and wherein the second screw on the second surface of the printed board is soldered on the printed board.

* * * * *